(12) United States Patent
Kim et al.

(10) Patent No.: US 9,985,235 B2
(45) Date of Patent: May 29, 2018

(54) ORGANIC LIGHT EMITTING DIODE AND ORGANIC LIGHT EMITTING DIODE DISPLAY INCLUDING THE SAME

(71) Applicant: SAMSUNG DISPLAY CO., LTD., Yongin-si, Gyeonggi-do (KR)

(72) Inventors: Dong Chan Kim, Gunpo-si (KR); Won Jong Kim, Suwon-si (KR); Eung Do Kim, Seoul (KR); Dong Kyu Seo, Hwaseong-si (KR); Da Hea Im, Seo-gu (KR); Sang Hoon Yim, Suwon-si (KR); Won Suk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 94 days.

(21) Appl. No.: 15/076,587

(22) Filed: Mar. 21, 2016

(65) Prior Publication Data

US 2016/0365529 A1    Dec. 15, 2016

(30) Foreign Application Priority Data

Jun. 15, 2015  (KR) .................. 10-2015-0084317

(51) Int. Cl.
*B32B 9/00* (2006.01)
*H01L 51/50* (2006.01)
*H01L 51/52* (2006.01)

(52) U.S. Cl.
CPC ...... *H01L 51/5092* (2013.01); *H01L 51/5036* (2013.01); *H01L 51/5056* (2013.01); *H01L 51/5265* (2013.01)

(58) Field of Classification Search
CPC .. C07F 9/587; C07F 15/06; C09K 2211/1029; C09K 2211/1044; C09K 2211/187; H01L 51/5036; H01L 51/504; H01L 27/3262
See application file for complete search history.

(56) References Cited

U.S. PATENT DOCUMENTS 5,677,572 A    10/1997 Hung et al.
2016/0285035 A1*  9/2016 Kim .................... H01L 51/5215

FOREIGN PATENT DOCUMENTS

JP    2005-251587 A    9/2005
KR    10-1383490 B1    4/2014

* cited by examiner

*Primary Examiner* — Shane Fang
(74) *Attorney, Agent, or Firm* — Lewis Roca Rothgerber Christie LLP

(57) ABSTRACT

An organic light emitting diode according to an example embodiment of the present disclosure includes: a first electrode; a second electrode facing the first electrode; an emission layer between the first electrode and the second electrode; and an electron injection layer between the second electrode and the emission layer. The electron injection layer includes a first halogen dipole material based on a transition or post-transition metal I, and a second halogen dipole material based on a metal having a work function of 4.0 eV or less.

18 Claims, 5 Drawing Sheets

ORGANIC LIGHT EMITTING DIODE AND ORGANIC LIGHT EMITTING DIODE DISPLAY INCLUDING THE SAME

CROSS-REFERENCE TO RELATED APPLICATION

This application claims priority to and the benefit of Korean Patent Application No. 10-2015-0084317 filed in the Korean Intellectual Property Office on Jun. 15, 2015, the entire content of which is incorporated herein by reference.

BACKGROUND

1. Field

One or more aspects of the present disclosure relate to an organic light emitting element and an organic light emitting diode display including the same.

2. Description of the Related Art

Recent attempts to decrease the weight and thickness of monitors, televisions, etc., have motivated replacement of cathode ray tube (CRT) displays with liquid crystal displays (LCDs). However, an LCD requires an additional backlight because the LCD is a passive light emitting device. Additionally, the LCD has limitations in terms of response speed and viewing angle.

Organic light emitting devices are self-emitting display elements having the advantages of a wide viewing angle, excellent contrast, and a fast response time, and have greatly attracted attention as display devices capable of overcoming the aforementioned limitations.

An organic light emitting device includes an organic light emitting element. The organic light emitting element forms excitons from the combination of electrons injected from one electrode and holes injected from another electrode into the emission layer, and the excitons emit energy in the form of visible light.

However, conventional organic light emitting devices have been limited by their high driving voltages, high light emission brightness, low luminance and light emission efficiencies, and short life spans.

The above information disclosed in this Background section is included only to enhance understanding of the background of the present disclosure, and may therefore contain information that does not form the prior art that is already known in this country to a person of ordinary skill in the art.

SUMMARY

One or more aspects of embodiments of the present disclosure are directed to an organic light emitting element having high efficiency and long life span, and a light emitting display including the same.

An organic light emitting diode according to an example embodiment of the present disclosure may include: a first electrode; a second electrode facing the first electrode; an emission layer between the first electrode and the second electrode; and an electron injection layer between the second electrode and the emission layer. The electron injection layer may include a first halogen dipole material based on a transition or post-transition metal, and a second halogen dipole material based on a metal having a work function of 4.0 eV or less.

The electron injection layer may include the first halogen dipole material as an iodine compound based on a transition or post-transition metal, and a second halogen dipole material as an iodine compound based on a metal having a work function of 4.0 eV or less.

The first halogen dipole material may include at least one material selected from $CuI$, $TlI$, $AgI$, $CdI_2$, $HgI_2$, $SnI_2$, $PbI_2$, $BiI_3$, $ZnI_2$, $MnI_2$, $FeI_2$, $CoI_2$, $NiI_2$, $AlI_3$, $ThI_4$, and $UI_3$ as the iodine compound based on a transition or post-transition metal.

The second halogen dipole material may include at least material one selected from $LiI$, $NaI$, $KI$, $RbI$, $CsI$, $BeI_2$, $MgI_2$, $CaI_2$, $SrI_2$, $BaI_2$, $YbI$, $YbI_2$, $YbI_3$, and $SmI_3$ as an iodine compound based on the Group 1, Group 2, and lanthanide metals.

The electron injection layer may be formed as a single layer.

An electron transport layer between the emission layer and the electron injection layer and a hole transport layer between the emission layer and the first electrode may be further included, wherein the hole transport layer and the electron transport layer may each include an organic material.

The electron injection layer may be formed as a plurality of layers, and the plurality of layers may each include at least one of the first halogen dipole material and the second halogen dipole material.

An organic light emitting diode display according to one or more example embodiments of the present disclosure may include: a substrate; a thin film transistor on the substrate; and an organic light emitting diode connected to the thin film transistor. The organic light emitting diode may include a first electrode; a second electrode facing the first electrode; an emission layer between the first electrode and the second electrode; and an electron injection layer between the second electrode and the emission layer, wherein the electron injection layer includes a first halogen dipole material based on a transition or post-transition metal, and a second halogen dipole material based on a metal having a work function of 4.0 eV or less.

The electron injection layer may include the first halogen dipole material as an iodine compound based on a transition or post-transition metal, and the second halogen dipole material as an iodine compound based on a metal having a work function of 4.0 eV or less.

The first halogen dipole material may include at least one material selected from $CuI$, $TlI$, $AgI$, $CdI_2$, $HgI_2$, $SnI_2$, $PbI_2$, $BiI_3$, $ZnI_2$, $MnI_2$, $FeI_2$, $CoI_2$, $NiI_2$, $AlI_3$, $ThI_4$, and $UI_3$ as the iodine compound based on the transition or post-transition metal.

The second halogen dipole material may include at least one selected from $LiI$, $NaI$, $KI$, $RbI$, $CsI$, $BeI_2$, $MgI_2$, $CaI_2$, $SrI_2$, $BaI_2$, $YbI$, $YbI_2$, $YbI_3$, and $SmI_3$ as an iodine compound based on the Group 1, Group 2, and lanthanide metals.

The electron injection layer may be formed as a single layer.

An electron transport layer between the emission layer and the electron injection layer as well as a hole transport layer between the emission layer and the first electrode may be further included, wherein the hole transport layer and the electron transport layer may each include an organic material.

The electron injection layer may be formed as a plurality of layers, and the plurality of layers may each independently include at least one selected from the first halogen dipole material and the second halogen dipole material.

The emission layer may include a red emission layer, a green emission layer, and a blue emission layer, and may further include an auxiliary layer under the blue emission layer.

A red resonance auxiliary layer under the red emission layer and a green resonance auxiliary layer under the green emission layer may be further included.

The auxiliary layer may include a compound represented by Chemical Formula 1:

Chemical Formula 1

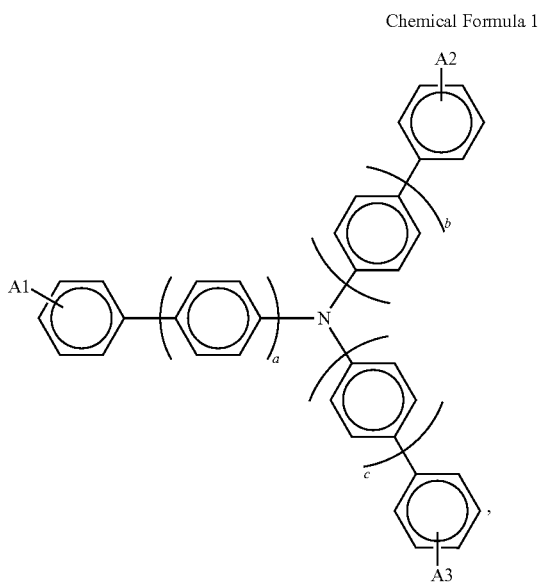

wherein, A1, A2, and A3 may each independently be selected from an alkyl group, an aryl group, carbazole, dibenzothiophene, dibenzofuran (DBF), or biphenyl, respectively, and a, b, and c may each independently be integers of 0 to 4.

The auxiliary layer may include a compound represented by Chemical Formula 2:

Chemical Formula 2

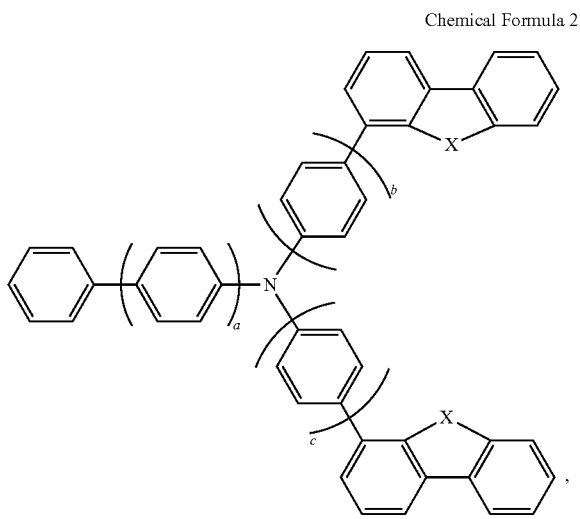

wherein a may be 0 to 3, b and c may each independently be integers of 0 to 3, X may be selected from oxygen (O), nitrogen (N), and sulfur (S), and each X may independently be the same as or different from each other.

According to an example embodiment of the present disclosure, the electron injection layer may include a halogen dipole material based on a transition or post-transition metal, and a metal having a low work function or a halogen dipole material based on a metal having a low work function, thereby providing an organic light emitting diode having good element stability and a long lifespan.

DETAILED DESCRIPTION

Figure 1:
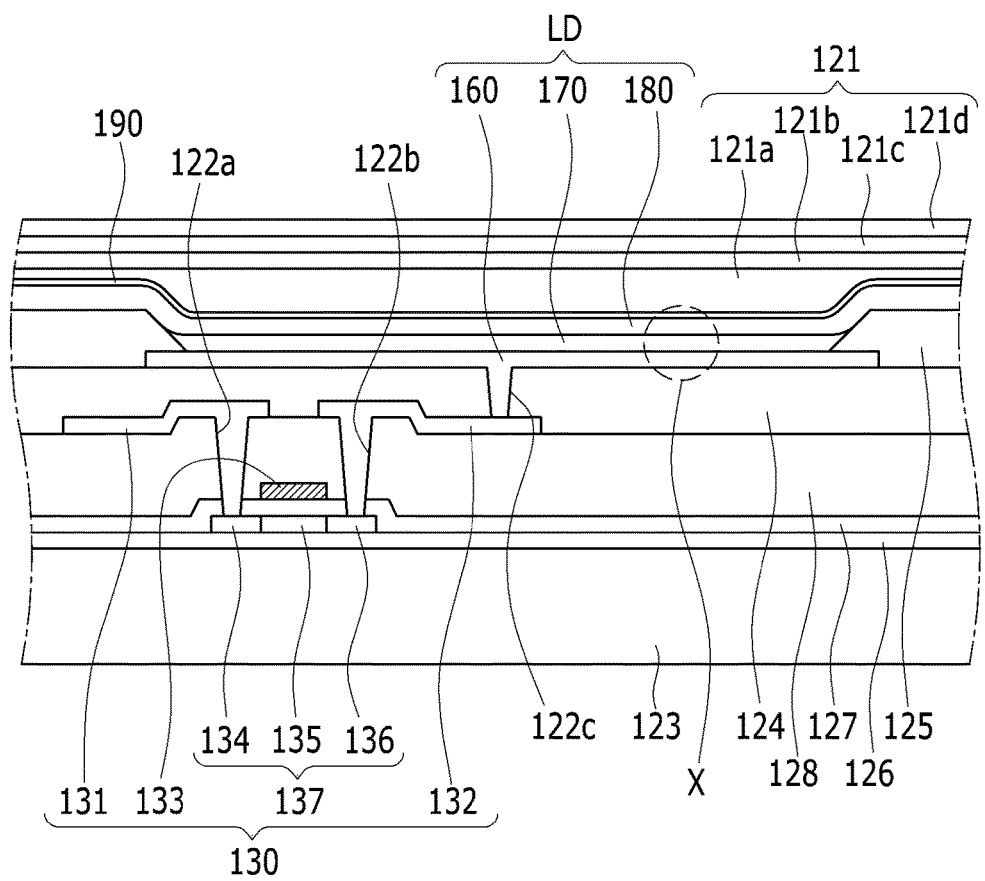
FIG. 1 is a cross-sectional view of an organic light emitting diode display according to an one or more embodiments of the present disclosure.

The present disclosure will be described more fully hereinafter with reference to the accompanying drawings, in which example embodiments of the disclosure are shown. As those skilled in the art would realize, the described embodiments may be modified in various different ways, all without departing from the spirit or scope of the present disclosure.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, no intervening elements are present.

Figure 2:
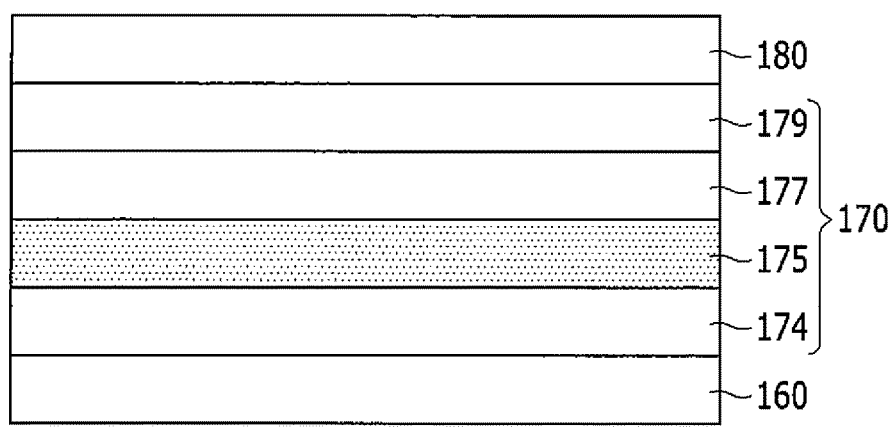
FIG. 2 is an enlarged cross-sectional view of the organic light emitting diode of FIG. 1, according to one or more embodiments of the present disclosure.

FIG. 1 is a cross-sectional view of an organic light emitting diode display according to an example embodiment of the present disclosure. FIG. 2 is an enlarged cross-sectional view of the example organic light emitting diode of FIG. 1.

A substrate 123 may be made of, for example, an inorganic material such as glass, an organic material such as polycarbonate, polymethylmethacrylate, polyethylene terephthalate, polyethylene naphthalate, a polyamide, polyether sulfone, or a combination thereof, or a silicon wafer.

In addition, a substrate buffer layer 126 may be positioned on the substrate 123. The substrate buffer layer 126 serves to prevent or reduce penetration of impure elements and to planarize the surface.

The substrate buffer layer 126 may be made of any material capable of performing the abovementioned functions. For example, one selected from a silicon nitride ($SiN_x$) layer, a silicon oxide ($SiO_y$) layer, and a silicon oxynitride ($SiO_yN_x$) layer may be used as the substrate buffer layer 126. However, the substrate buffer layer 126 is not necessarily required, and may be omitted as appropriate in some embodiments, according to the material and process conditions used for substrate 123.

A driving semiconductor layer 137 may be formed on the substrate buffer layer 126. The driving semiconductor layer 137 may be formed of a material including polysilicon. Further, the driving semiconductor layer 137 may include a channel region 135 in which impurities are not doped, and a source region 134 and a drain region 136 in which the impurities are doped at both sides of the channel region 135. In this case, the doped ion materials may be p-type (e.g., p-channel) impurities such as boron (B) and $B_2H_6$. Here, the impurities may vary according to a kind of thin film transistor.

A gate insulating layer 127 made of a silicon nitride ($SiN_x$) or a silicon oxide ($SiO_y$) may be formed on the driving semiconductor layer 137. A gate wire including a driving gate electrode 133 may be formed on the gate insulating layer 127. The driving gate electrode 133 may be formed to overlap at least a part of the driving semiconductor layer 137, particularly, the channel region 135.

An interlayer insulating layer 128 covering the driving gate electrode 133 may be formed on the gate insulating layer 127. A first contact hole 122a and a second contact hole 122b that respectively expose the source area 134 and the drain area 136 of the driving semiconductor 137 may be formed in the gate insulating layer 127 and the interlayer insulating layer 128. Like the gate insulating layer 127, the interlayer insulating layer 128 may be made of a material such as a silicon nitride ($SiN_x$) or a silicon oxide ($SiO_y$).

In addition, a data wire including a driving source electrode 131 and a driving drain electrode 132 may be positioned on the interlayer insulating layer 128. Further, the driving source electrode 131 and the driving drain electrode 132 may be respectively connected with the source area 134 and the drain area 136 of the driving semiconductor layer 137 through the first contact hole 122a and the second contact hole 122b, respectively formed in the interlayer insulating layer 128 and the gate insulating layer 127.

A driving thin film transistor 130 including the driving semiconductor layer 137, the driving gate electrode 133, the driving source electrode 131, and the driving drain electrode 132 may be formed as described. The configuration of the driving thin film transistor 130 is not limited to the aforementioned example, and various modifications may be easily implemented by those skilled in the art.

A planarization layer 124 covering the data wire may be formed on the interlayer insulating layer 128. The planarization layer 124 serves to remove and planarize a stepped surface in order to increase the emission efficiency of the organic light emitting element to be formed thereon. The planarization layer 124 may have a third contact hole 122c exposing a part of the drain electrode 132.

The planarization layer 124 may be made of one or more materials, such as a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

Example embodiments of the present disclosure are not limited to the aforementioned structure, and in some cases, at least one of the planarization layer 124 and the interlayer insulating layer 128 may be omitted.

In one or more embodiments, the first electrode of an organic light emitting element, that is, a pixel electrode 160, may be formed on the planarization layer 124. The organic light emitting diode device may include a plurality of pixel electrodes 160 which correspond to a plurality of pixels. The plurality of pixel electrodes 160 may be spaced apart from each other. The pixel electrode 160 may be connected to the drain electrode 132 through the third contact hole 122c of the planarization layer 124.

Furthermore, a pixel defining layer 125 having an opening that exposes the pixel electrode 160 may be formed on the planarization layer 124. In other words, the pixel defining layer 125 may form a plurality of openings for each pixel. In this case, a light-emitting element layer 170 may be positioned within each opening formed by the pixel defining layer 125. Accordingly, a pixel area in which each light-emitting element layer 170 is bordered by the pixel defining layer 125 may be defined.

In this case, the position of the pixel electrode 160 may correspond to the opening of the pixel defining layer 125. However, the pixel electrode 160 may not necessarily be positioned only in the opening of the pixel defining layer 125, but may be positioned below the pixel defining layer 125 so that a part of the pixel electrode 160 overlaps with the pixel defining layer 125.

The pixel defining layer 125 may be made of a resin such as a polyacrylate resin and a polyimide resin, a silica-based inorganic material, and/or the like.

The light-emitting element layer 170 may be formed on the pixel electrode 160. Example structures of the light-emitting element layer 170 will be described in more detail hereinafter.

A second electrode, for example, a common electrode 180, may be formed on the light-emitting element layer 170. As described, an organic light emitting element LD including the pixel electrode 160, the light-emitting element layer 170, and the common electrode 180 is formed.

In this case, the pixel electrode 160 and the common electrode 180 may be made of a transparent, transflective, or reflective conductive material. Depending on the kind of materials forming the pixel electrode 160 and the common electrode 180, the organic light emitting diode device may be a top emission type (e.g., top emission device), a bottom emission type (e.g., bottom emission device), or a double-sided emission type (e.g., double-sided emission device).

An overcoat 190 covering and protecting the common electrode 180 may be formed as an organic layer on the common electrode 180.

A thin film encapsulation layer 121 may be formed on the overcoat 190. The thin film encapsulation layer 121 encapsulates and protects the organic light emitting element LD and a driving circuit part formed on the substrate 123 from the external environment.

The thin film encapsulation layer 121 may include organic encapsulation layers 121a and 121c and inorganic encapsulation layers 121b and 121d, which may be alternately laminated. For example, FIG. 1 illustrates a case where two organic encapsulation layers 121a and 121c and two inorganic encapsulation layers 121b and 121d are alternately laminated to configure the thin film encapsulation layer 121, but embodiments are not limited thereto.

Hereinafter, an organic light emitting element according to an example embodiment of the present disclosure will be described with reference to FIG. 2.

Referring to the example embodiment in FIG. 2, the organic light emitting element (labeled as part X in FIG. 1) includes a structure in which a first electrode 160, a hole transport layer 174, an emission layer 175, an electron transport layer 177, an electron injection layer 179, and a second electrode 180 are sequentially layered.

When the first electrode 160 is an anode, a material having a high work function may be selected to facilitate easy hole injection. The first electrode 160 may be a transparent electrode or an opaque electrode. When the first electrode 160 is a transparent electrode, it may be made of a conductive oxide such as indium-tin oxide (ITO), indium-zinc oxide (IZO), tin oxide ($SnO_2$), zinc oxide (ZnO), and/or combinations thereof, or a thin film of a metal such as aluminum (Al), silver (Ag), and/or magnesium (Mg). When the first electrode 160 is an opaque electrode, it may be made of a metal such as aluminum, silver, and/or magnesium.

The first electrode 160 may be formed as a structure of two or more-layers including different kinds of materials. For example, the first electrode 160 may have a structure in which indium-tin oxide (ITO)/silver (Ag)/indium-tin oxide (ITO) are sequentially stacked.

The first electrode 160 may be formed by sputtering or vacuum deposition.

The hole transport layer 174 may be positioned on the first electrode 160. The hole transport layer 174 may serve to smoothly transport holes transmitted from a hole injection layer. The hole transport layer 174 may include an organic material. For example, the hole transport layer 174 may include NPD (e.g., N,N-dinaphthyl-N,N'-diphenyl benzidine), TPD (e.g., N,N'-bis-(3-methylphenyl)-N,N'-bis-(phenyl)-benzidine), s-TAD (e.g., 2,2',7,7'-tetrakis-(diphenylamino)spiro-9,9'-bifluorene), MTDATA (e.g., 4,4',4''-tris(N-3-methylphenyl-N-phenyl-amino)-triphenylamine), and the like, but is not limited thereto.

The thickness of the hole transport layer 174 may be about 15 nm to about 25 nm. In some embodiments, the thickness of the hole transport layer 174 may be about 20 nm. In the present example embodiment, a hole injection material is included in the hole transport layer 174 as a modification of the hole transport layer 174, and thus the hole transport/injection layers may be formed as a single layer.

The emission layer 175 may be positioned on the hole transport layer 174. The emission layer 175 may include an emission material that represents a specific color. For example, the emission layer 175 may display a color such as blue, green, red, or a combination thereof.

The thickness of the emission layer 175 may be about 10 nm to about 50 nm. The emission layer 175 may include a host and a dopant. The emission layer 175 may include a material that emits red light, green light, blue light, or white light, and may be formed using a phosphorescent or fluorescent material.

When the emission layer 175 emits red light, the emission layer 175 may include a host material such as CBP (e.g., carbazole biphenyl) or mCP (e.g., 1,3-bis(carbazol-9-yl)), and may include at least one phosphorescent dopant material such as PIQIr(acac) (e.g., bis(1-phenylisoquinoline)acetylacetonate iridium), PQIr(acac) (e.g., bis(1-phenylquinoline)acetylacetonate iridium), PQIr (e.g., tris(1-phenylquinoline)iridium), and/or PtOEP (e.g., octaethylporphyrin platinum), and/or a fluorescent dopant material such as PBD, Eu(DBM)$_3$(Phen), and/or perylene, but this is not restrictive.

When the emission layer 175 emits green light, the emission layer 175 may include a host material such as CBP and/or mCP, and may include at least one phosphorescent dopant material such as Ir(ppy)$_3$ (e.g., fac-tris(2-phenylpyridine)iridium) and/or fluorescent dopant material such as Alq$_3$ (e.g., tris(8-hydroxyquinolino)aluminum), but this is not restrictive.

When the emission layer 175 emits blue light, the emission layer 175 may include a host material such as CBP and/or mCP, and may include at least one phosphorescent dopant material such as (4,6-F$_2$ppy)$_2$Irpic. Alternatively, the emission layer 175 may include at least one fluorescent dopant material such as spiro-DPVBi, spiro-6P, distyrylbenzene (DSB), distyrylarylene (DSA), a PFO-based polymer, and/or a PPV-based polymer, but this is not restrictive.

The electron transport layer 177 may be positioned on the emission layer 175. The electron transport layer 177 may transfer electrons from the second electrode 180 to the emission layer 175. In addition, the electron transport layer 177 may prevent or reduce the movement of holes injected from the first electrode 160 into the second electrode 180 via the emission layer 175. The electron transport layer 177 may help holes and electrons combine in the emission layer 175 by functioning as a hole blocking layer.

The electron transport layer 177 may include an organic material. For example, the electron transport layer 177 may include one or more compounds selected from the group consisting of Alq$_3$ (e.g., tris(8-hydroxyquinolino)-aluminum), PBD, TAZ, spiro-PBD, BAlq, and/or SAlq, but it is not limited thereto.

The electron injection layer 179 may be positioned on the electron transport layer 177. The electron injection layer 179 may serve to enhance electron injection into the electron transport layer 177 from the second electrode 180.

The thickness of the electron injection layer 179 may be in the range of about 1 nm to about 50 nm.

In the present example embodiment, the electron injection layer 179 may include a first halogen dipole material based on a transition or post-transition metal, and a second halogen dipole material based on a metal having a work function equal to or less than 4.0 eV. As used herein, "halogen dipole material" may refer to "a material containing highly polar bonds to halogen atoms". In the present example embodiment, the electron injection layer 179 may include the first halogen dipole material as an iodine compound based on a transition or post-transition metal, and the second halogen dipole material as an iodine compound based on a metal having a work function of 4.0 eV or less.

In the present example embodiment, a single electron injection layer may be formed through co-deposition of the first halogen dipole material and the second halogen dipole material.

In the present example embodiment, the first halogen dipole material may be based on a transition or post-transition metal. Non-limiting examples of the transition metal may include the majority of elements from Group 3 to Group 12 in the periodic table. As used herein, "post-transition metal" may refer to a metal in a group later than the transition metal groups, and may refer to a metal having an electronegativity that is lower than those of the transition metals and higher than those of the alkali and alkaline earth metals. Non-limiting examples of post-transition metals include aluminum (Al), gallium (Ga), indium (In), tin (Sn), thallium (Tl), lead (Pb), bismuth (Bi), and polonium (Po). Moreover, the first halogen dipole material may include at least one selected from the group including CuI, TlI, AgI, CdI$_2$, HgI$_2$, SnI$_2$, PbI$_2$, BiI$_3$, ZnI$_2$, MnI$_2$, FeI$_2$, CoI$_2$, NiI$_2$, AlI$_3$, ThI$_4$, and UI$_3$.

In the present example embodiment, the second halogen dipole material may be based on a metal selected from the alkali metals of Group 1, the alkali earth metals of Group 2, and the lanthanide metals. The second halogen dipole material may include at least one metal selected from ytterbium (Yb), lithium (Li), sodium (Na), potassium (K), rubidium (Rb), cesium (Cs), calcium (Ca), strontium (Sr), barium (Ba), cerium (Ce), samarium (Sm), europium (Eu), gadolinium (Gd), lanthanum (La), neodymium (Nd), terbium (Tb), lutetium (Lu), magnesium (Mg), alloys thereof, and combinations thereof. For example, the second halogen dipole material may include at least one selected from the group including LiI, NaI, KI, RbI, CsI, BeI$_2$, MgI$_2$, CaI$_2$, SrI$_2$, BaI$_2$, YbI, YbI$_2$, YbI$_3$, and SmI$_3$.

When the electron injection layer only includes a halogen dipole material based on a metal with a low work function, if the low work function metal is highly reactive, the metal may be dissociated or oxidized in the element such that efficiency and lifespan are reduced. However, according to the present example embodiment, the organic light emitting diode LD may include a halogen dipole material based on a transition metal in which the reactivity is not high or a halogen dipole material based on a post-transition metal, such that the stability of the element and the lifespan of the element may be increased.

In this regard, when the electron injection layer 179 according to an example embodiment of the present disclosure is formed by co-depositing a first halogen dipole material of CuI and a second halogen dipole material of RbI, compared with the case of only using a second halogen dipole material such as Yb and/or RbI, it can be confirmed that the efficiency of the element is increased and the lifespan deterioration is lowered.

Also, in the case when the electron injection layer 179 includes only CuI as the halogen dipole material based on a transition metal, compared with the case when the electron injection layer includes a low work function metal or a halogen dipole material based on a low work function metal, it can be confirmed that the lifespan efficiency is increased.

This will be described in more detail with reference to Table 1. Table 1 shows the efficiency and the lifespan of the emissive display device when the electron injection layer 179 is formed according to various example embodiments of the present disclosure.

Here, Example Embodiment 1 is a case in which CuI as the halogen dipole material based on a transition metal and RbI as the halogen dipole material based on a low work function metal are co-deposited. Example Embodiment 2 is a case in which CuI as the first halogen dipole material and Yb as the low work function metal are co-deposited, and Example Embodiment 3 is a case in which only CuI as the halogen dipole material based on a transition metal is formed with a single layer.

Meanwhile, Comparative Example 1 is a case in which a single layer of Yb as the low work function metal is deposited for the electron injection layer 179, and Comparative Example 2 is a case in which a single layer of RbI as the halogen dipole material based on a low work function metal is deposited for the electron injection layer 179.

TABLE 1

| | Driving voltage | Color coordinates | | Emission efficiency | Lifespan |
|---|---|---|---|---|---|
| | (V) | CIE_X | CIE_Y | (cd/A) | 150 h |
| Comparative Example 1 | 4.2 | 0.137 | 0.054 | 111.0 | 97% |
| Comparative Example 2 | 4.2 | 0.137 | 0.054 | 140.7 | 95% |
| Example Embodiment 1 | 4.2 | 0.138 | 0.055 | 144.1 | 98% |
| Example Embodiment 2 | 4.1 | 0.136 | 0.057 | 136.9 | 98% |
| Example Embodiment 3 | 4.4 | 0.137 | 0.055 | 133.0 | 99% |

The emission efficiency refers to the initial luminance, and the lifespan refers to the luminance after 150 h as compared to the initial emission luminance of 100%.

Referring to Table 1, it may be confirmed that the efficiencies and lifespans of the Example Embodiments 1 to 3 compared with the Comparative Examples 1 to 2 are excellent while having similar color coordinates.

The second electrode 180 may be positioned on the electron injection layer 179. When the second electrode 180 is a cathode, a material having a low work function may be included to facilitate easy electron injection. For example, the material may be selected from a metal such as magnesium, calcium, sodium, potassium, titanium (Ti), indium, yttrium (Y), lithium, gadolinium, aluminum, silver, tin, lead, cesium, barium, and the like, alloys thereof, combinations thereof, and a multi-layered material such as LiF/Al, LiO$_2$/Al, LiF/Ca, LiF/Al, and/or BaF$_2$/Ca, but this is not restrictive.

When the second electrode 180 is formed of an above-stated alloy, an appropriate alloy ratio may be selected and controlled via the deposition source temperatures, the atmosphere, and the degree of vacuum.

The second electrode 180 may be formed of two or more layers.

Figure 3:
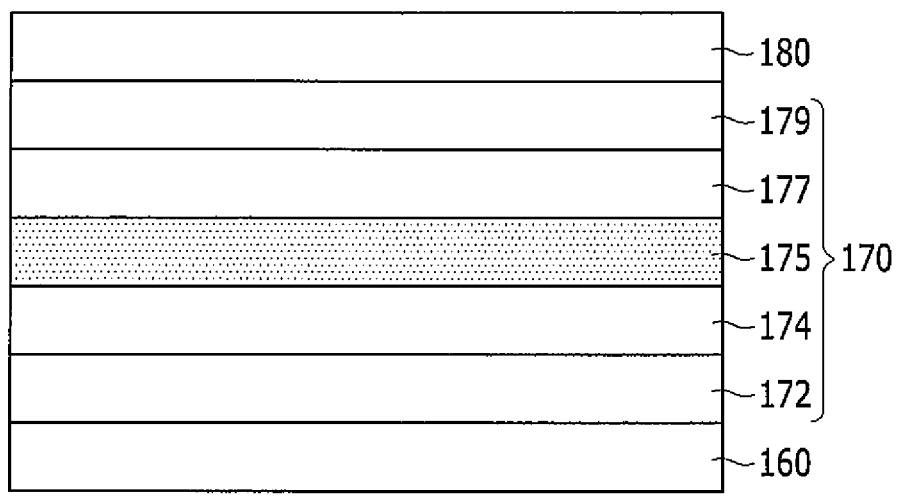
FIG. 3 is a cross-sectional view of a partial variation of the organic light emitting diode of FIG. 2, according to one or more embodiments of the present disclosure.

FIG. 3 is a cross-sectional view of a partially modified embodiment of the organic light emitting element of FIG. 2.

FIG. 3 depicts an embodiment in which a hole injection layer 172 is included in the organic light emitting diode LD of the example embodiment of FIG. 2. In the example embodiment of FIG. 3, the hole injection layer 172 may be positioned between the hole transport layer 174 and the first electrode 160. The hole injection layer 172 may facilitate easy injection of holes from the first electrode 160 to the hole transport layer 174. In the present example embodiment, the hole injection layer 172 may include a halogen dipole material where a metal or non-metal having a work function of 4.3 eV or more and a halogen are combined. However, the hole injection layer 172 may be formed of another inorganic or organic material.

The metal or non-metal having a work function of 4.3 eV or more may be an element selected from the group consisting of silver (Ag), gold (Au), boron (B), beryllium (Be), carbon (C), cobalt (Co), chromium (Cr), copper (Cu), iron (Fe), mercury (Hg), iridium (Ir), molybdenum (Mo), niobium (Nb), nickel (Ni), osmium (Os), palladium (Pd), platinum (Pt), rhenium (Re), rhodium (Rh), ruthenium (Ru), antimony (Sb), selenium (Se), silicon (Si), tin (Sn), tantalum (Ta), tellurium (Te), titanium (Ti), vanadium (V), tungsten (W), and zinc (Zn).

Except for the above-described difference, the contents described with reference to FIG. 2 may be applied to the example embodiment of FIG. 3.

Figure 4:
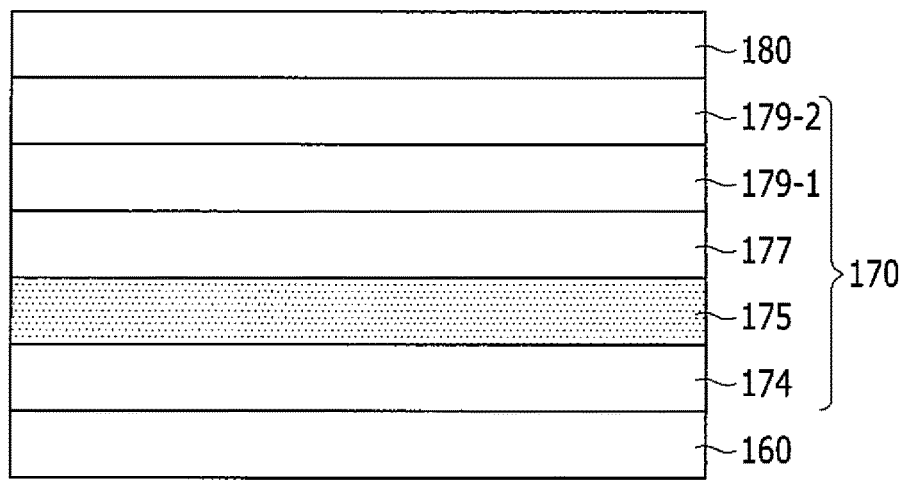
FIG. 4 is a cross-sectional view of a partial variation of the organic light emitting diode of FIG. 2, according to one or more embodiments of the present disclosure.

FIG. 4 is a cross-sectional view of a partially modified example embodiment of the organic light emitting element of FIG. 2.

Referring to FIG. 4, the electron injection layer 179 of the example embodiment of FIG. 2 may be double-layered in the organic light emitting element LD. In the present example embodiment, the electron injection layer 179 may include a first electron injection layer 179-1 and a second electron injection layer 179-2 that are sequentially layered. The first electron injection layer 179-1 may include a halogen dipole material based on a transition or post-transition metal, and the second electron injection layer 179-2 may include a halogen dipole material based on a metal having the work function of 4.0 eV or less. Further, the first electron injection layer 179-1 may include a halogen dipole material based on a metal having a work function of 4.0 eV or less, and the second electron injection layer 179-2 may include a halogen dipole material based on a transition or post-transition metal.

Except for the above-described difference, the contents described with reference to FIG. 2 may be applied to the example embodiment of FIG. 4.

Figure 5:
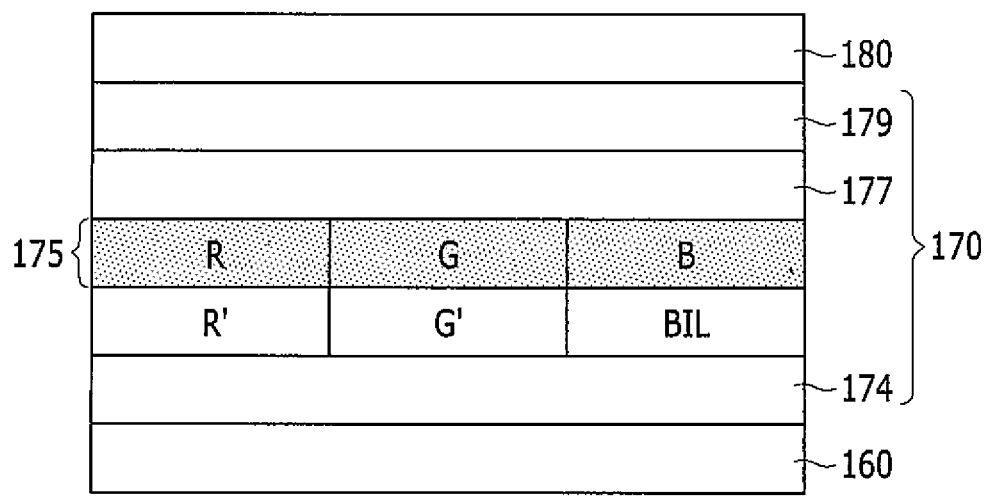
FIG. 5 is a cross-sectional view of a partial variation of the organic light emitting diode of FIG. 2, according to one or more embodiments of the present disclosure.

FIG. 5 is a cross-sectional view of a partially modified example embodiment of the organic light emitting element of FIG. 2.

Referring to FIG. 5, the emission layer 175 in the organic light emitting element LD of FIG. 4 may be modified. In the example embodiment of FIG. 5, the emission layer 175 may include a red emission layer R, a green emission layer G, and a blue emission layer B. An assistant layer BIL may also be included to improve the efficiency of the blue emission layer B at the lower end of the blue emission layer B. The red emission layer R may be about 30 nm to about 50 nm thick, the green emission layer G may be about 10 nm to about 30 nm thick, and the blue emission layer B may be about 10 nm to about 30 nm thick. The assistant layer BIL located at the lower end of the blue emission layer B may be about 20 nm or less in thickness. The assistant layer BIL may improve the efficiency of the blue emission layer B by controlling the hole charge balance. The assistant layer BIL may include a compound represented by Chemical Formula 1.

Chemical Formula 1

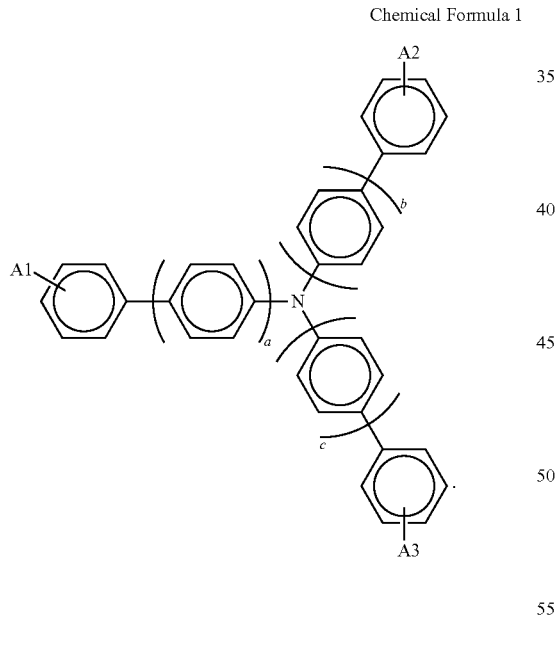

Chemical Formula 1-1

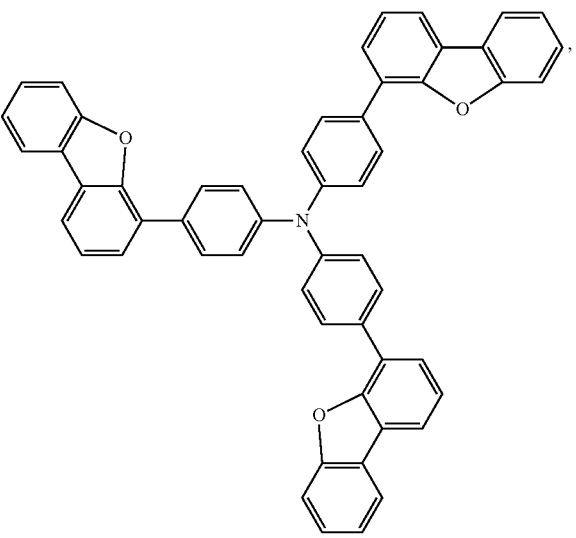

Chemical Formula 1-2

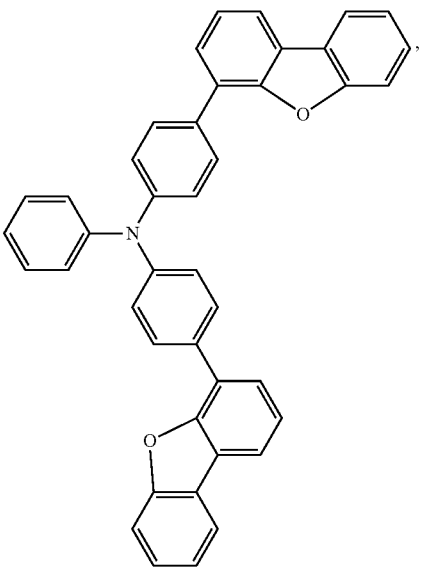

Chemical Formula 1-3

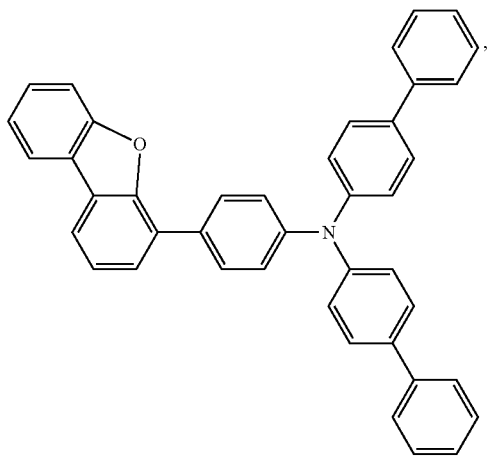

In Chemical Formula 1, A1, A2, and A3 may each independently be selected from an alkyl group, an aryl group, carbazole, dibenzothiophene, dibenzofuran (DBF), and biphenyl, and a, b, and c may each independently be integers of 0 to 4.

As an example of the compounds represented by Chemical Formula 1, the following Chemical Formulas 1-1, 1-2, 1-3, 1-4, 1-5, and 1-6 may be included.

Chemical Formula 1-4

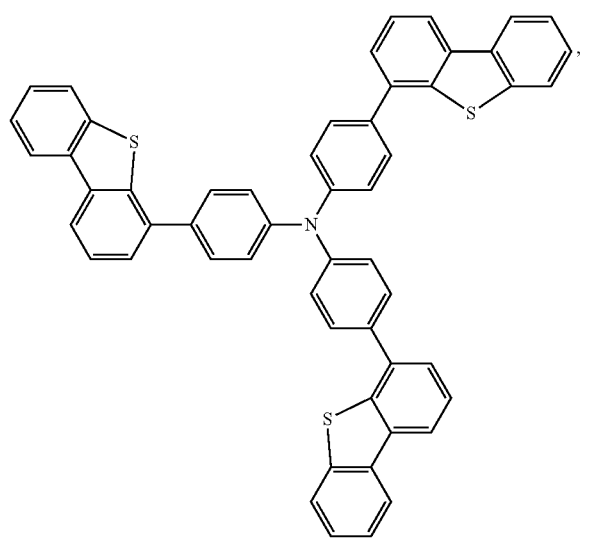

Chemical Formula 1-5

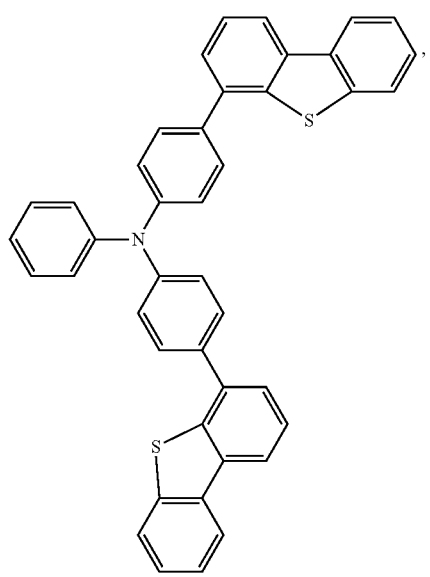

Chemical Formula 1-6

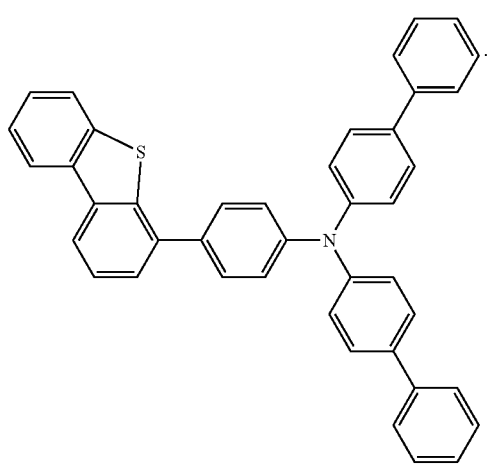

In another example embodiment, the assistant layer BIL may include a compound represented by Chemical Formula 2.

Chemical Formula 2

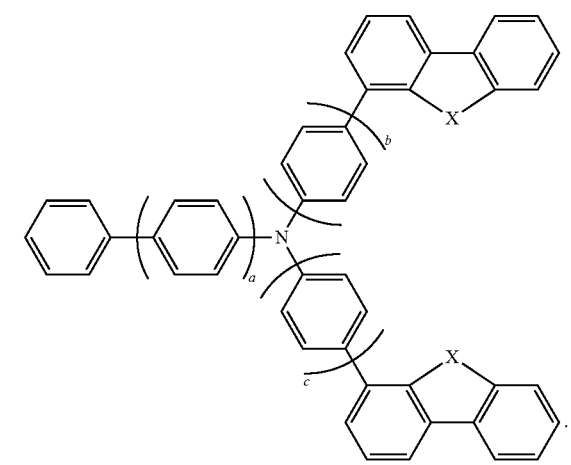

In Chemical Formula 2, a may be 0 to 3, b and c may each independently be integers of 0 to 3, X may be selected from O, N, and S, and each X may independently be the same as or different from each other.

As an example of the compounds representing Chemical Formula 2, Chemical Formulas 2-1, 2-2, 2-3, 2-4, 2-5, and 2-6 may be included.

Chemical Formula 2-1

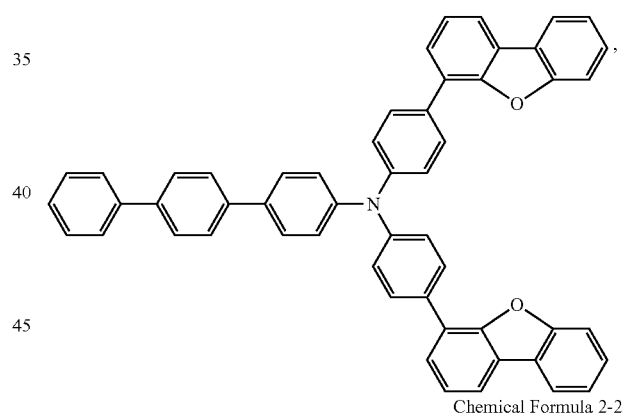

Chemical Formula 2-2

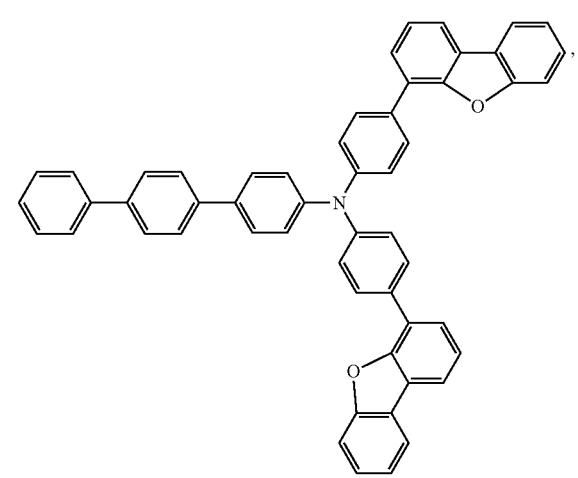

Chemical Formula 2-3
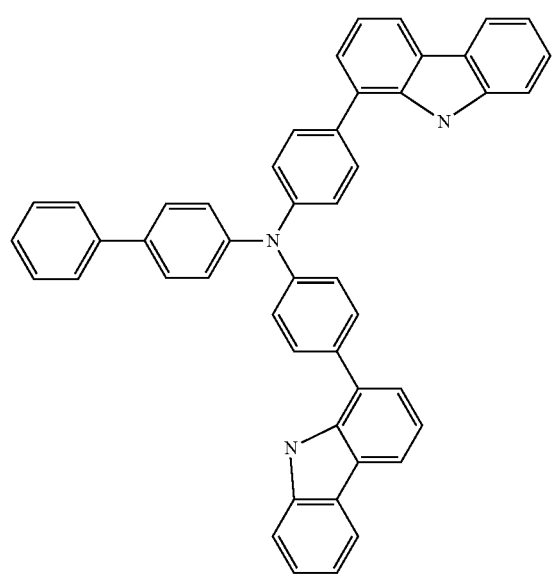
Chemical Formula 2-5
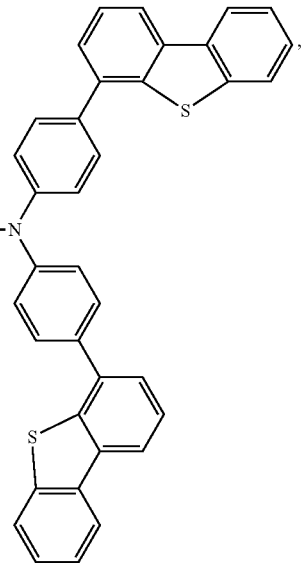
Chemical Formula 2-6
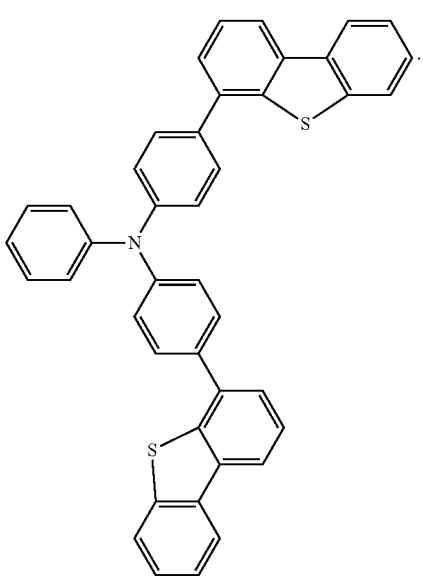
Chemical Formula 2-4
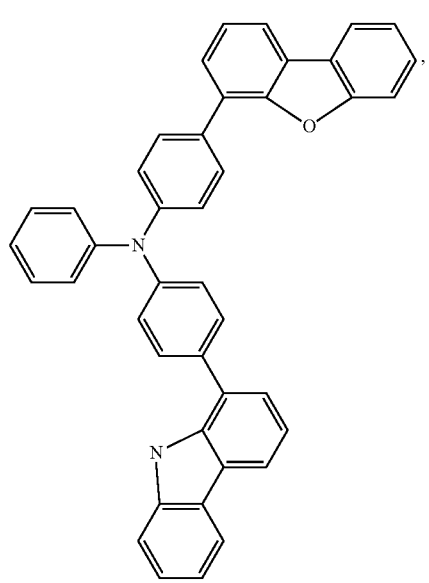
In another example embodiment, the assistant BIL may include a compound represented by Chemical Formula 3.
Chemical Formula 3
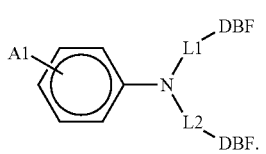
In Chemical Formula 3, A1 may be selected from an alkyl group, an aryl group, carbazole, dibenzothiophene, and dibenzofuran (DBF), L1 and L2 may each be

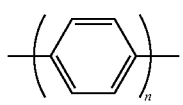

(where n is 0 to 3), and the DBF moieties connected to L1 and L2 may be replaced by carbazole or dibenzothiophene.

Hereinafter, a composition method of the assistant layer BIL according to an example embodiment of the present disclosure will be described. For example, the composition method of the following Chemical Formula 1-1 is described.

Chemical Formula 1-1

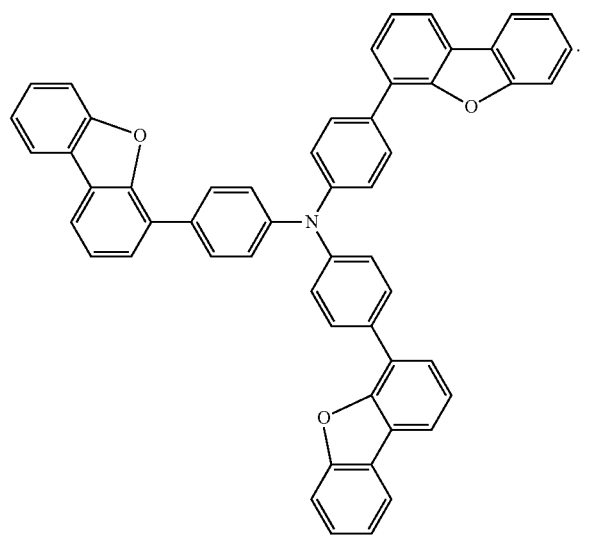

Composition Example

Under an argon atmosphere, 6.3 g of 4-dibenzofuran boronic acid, 4.8 g of 4,4',4"-tribromotriphenylamine, 104 mg of Pd(PPh$_3$)$_4$ (e.g., tetrakis(triphenylphosphine)palladium), 48 mL of a sodium carbonate (Na$_2$CO$_3$) solution (2 M), and 48 mL of toluene were placed in a 300 mL 3-neck flask, and reacted at 80° C. for eight hours. The reaction solution was extracted with toluene/water and dried with anhydrous sodium sulfate. The resultant solution was evaporated under low pressure, and 3.9 g of a yellowish-white powder was obtained through column purification of the obtained crude product.

As shown in FIG. 5, a red resonance auxiliary layer R' may be positioned under the red emission layer R, and a green resonance auxiliary layer G' may be positioned under the green emission layer G. The red resonance auxiliary layer R' and the green resonance auxiliary layer G' may be added to adjust the resonance distance for each color. Additionally, a separate resonance auxiliary layer may be positioned between the blue emission layer B and the auxiliary layer BIL, and the hole transport layer 174 may be omitted under the blue emission layer B and the auxiliary layer BIL.

Except for the above-described difference, the contents described with reference to FIG. 2 may be applied to the example embodiment of FIG. 5.

As used herein, expressions such as "at least one of", "one of", "at least one selected from", and "one selected from", when preceding a list of elements, modify the entire list of elements and do not modify the individual elements of the list. Further, the use of "may" when describing embodiments of the present invention refers to "one or more embodiments of the present invention".

In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims and equivalents thereof.

What is claimed is:

1. An organic light emitting diode comprising:
  a first electrode,
  a second electrode facing the first electrode;
  an emission layer between the first electrode and the second electrode; and
  an electron injection layer between the second electrode and the emission layer,
  wherein the electron injection layer includes a first halogen dipole material based on a transition or post-transition metal, and
  a second halogen dipole material based on a metal having a work function of 4.0 eV or less.

2. The organic light emitting diode of claim 1, wherein:
  the first halogen dipole material in the electron injection layer is an iodine compound based on a transition or post-transition metal, and
  the second halogen dipole material is an iodine compound based on a metal having a work function of 4.0 eV or less.

3. The organic light emitting diode of claim 2, wherein the first halogen dipole material includes at least one material selected from CuI, TiI, AgI, CdI$_2$, HgI$_2$, SnI$_2$, PbI$_2$, BiI$_3$, $ZnI_2$, $MnI_2$, $FeI_2$, $CoI_2$, $NiI_2$, $AlI_3$, $ThI_4$, and $UI_3$ as the iodine compound based on the transition or post-transition metal.

4. The organic light emitting diode of claim 2, wherein the second halogen dipole material includes at least one material selected from LiI, NaI, KI, RbI, CsI, $BeI_2$, $MgI_2$, $CaI_2$, $SrI_2$, $BaI_2$, YbI, $YbI_2$, $YbI_3$, and $SmI_3$ as an iodine compound based on the Group 1, Group 2, and lanthanide metals.

5. The organic light emitting diode of claim 1, wherein the electron injection layer is formed as a single layer.

6. The organic light emitting diode of claim 5, further comprising:
an electron transport layer between the emission layer and the electron injection layer; and
a hole transport layer between the emission layer and the first electrode,
wherein the hole transport layer and the electron transport layer each include an organic material.

7. The organic light emitting diode of claim 1, wherein:
the electron injection layer has a structure formed as a plurality of layers, and
the plurality of layers each include at least one of the first halogen dipole material and the second halogen dipole material.

8. An organic light emitting diode display comprising:
a substrate;
a thin film transistor on the substrate; and
an organic light emitting diode connected to the thin film transistor,
wherein the organic light emitting diode includes:
a first electrode;
a second electrode facing the first electrode;
an emission layer between the first electrode and the second electrode; and
an electron injection layer between the second electrode and the emission layer,
wherein the electron injection layer includes a first halogen dipole material based on a transition or post-transition metal, and
a second halogen dipole material based on a metal having a work function of 4.0 eV or less.

9. The organic light emitting diode display of claim 8, wherein:
the electron injection layer includes the first halogen dipole material as an iodine compound based on a transition or post-transition metal, and
the second halogen dipole material as an iodine compound based on a metal having a work function of 4.0 eV or less.

10. The organic light emitting diode display of claim 9, wherein the first halogen dipole material includes at least one material selected from CuI, TiI, AgI, $CdI_2$, $HgI_2$, $SnI_2$, $PbI_2$, $BiI_3$, $ZnI_2$, $MnI_2$, $FeI_2$, $CoI_2$, $NiI_2$, $AlI_3$, $ThI_4$, and $UI_3$ as the iodine compound based on the transition or post-transition metal.

11. The organic light emitting diode display of claim 9, wherein the second halogen dipole material includes at least one material selected from LiI, NaI, KI, RbI, CsI, $BeI_2$, $MgI_2$, $CaI_2$, $SrI_2$, $BaI_2$, YbI, $YbI_2$, $YbI_3$, and $SmI_3$ as the iodine compound based on the Group 1, Group 2, and lanthanide metals.

12. The organic light emitting diode display of claim 8, wherein the electron injection layer is formed as a single layer.

13. The organic light emitting diode display of claim 12, wherein:
an electron transport layer is between the emission layer and the electron injection layer, and
a hole transport layer is between the emission layer and the first electrode,
wherein the hole transport layer and the electron transport layer each independently include an organic material.

14. The organic light emitting diode display of claim 8, wherein:
the electron injection layer has a structure formed as a plurality of layers, and
the plurality of layers each independently include at least one material selected from the first halogen dipole material and the second halogen dipole material.

15. The organic light emitting diode display of claim 8, wherein the emission layer includes a red emission layer, a green emission layer, and a blue emission layer, and further includes an auxiliary layer under the blue emission layer.

16. The organic light emitting diode display of claim 15, wherein a red resonance auxiliary layer is under the red emission layer and a green resonance auxiliary layer is under the green emission layer.

17. The organic light emitting diode display of claim 15, wherein the auxiliary layer includes a compound represented by Chemical Formula 1:

Chemical Formula 1

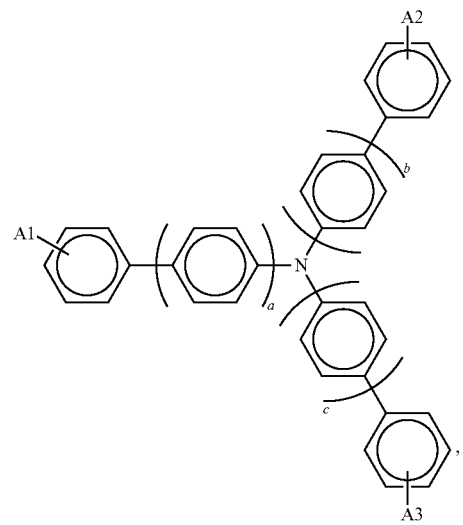

wherein, in Chemical Formula 1, A1, A2, and A3 are each independently selected from an alkyl group, an aryl group, carbazole, dibenzothiophene, dibenzofuran (DBF), and biphenyl, and a, b, and c are each independently an integer of 0 to 4.

18. The organic light emitting diode display of claim 15, wherein the auxiliary layer includes a compound represented by Chemical Formula 2:

Chemical Formula 2
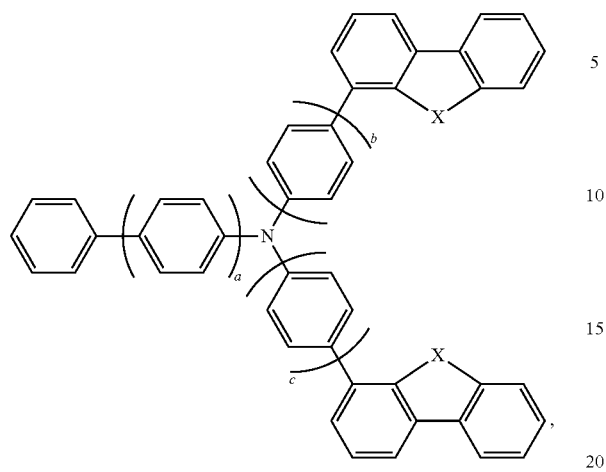
wherein, in Chemical Formula 2, a is 0 to 3, b and c are each independently an integer of 0 to 3, X is selected from O, N, and S, and each X is independently the same as or different from each other.
* * * * *